(12) United States Patent
Kitamura et al.

(10) Patent No.: US 12,250,792 B2
(45) Date of Patent: Mar. 11, 2025

(54) HEAT PIPES OF AN ELECTRONIC APPARATUS AND METHOD OF MANUFACTURING THE SAME

(71) Applicant: Lenovo (Singapore) Pte. Ltd., Singapore (SG)

(72) Inventors: Masahiro Kitamura, Kanagawa (JP); Takuroh Kamimura, Kanagawa (JP); Akinori Uchino, Kanagawa (JP); Ryota Watanabe, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 176 days.

(21) Appl. No.: 17/931,901

(22) Filed: Sep. 14, 2022

(65) Prior Publication Data

US 2023/0124239 A1    Apr. 20, 2023

(30) Foreign Application Priority Data

Oct. 20, 2021 (JP) ................................. 2021-171882

(51) Int. Cl.
*H05K 7/20* (2006.01)
*F28D 15/02* (2006.01)
*F28D 15/04* (2006.01)
*G06F 1/20* (2006.01)

(52) U.S. Cl.
CPC ......... *H05K 7/20336* (2013.01); *F28D 15/04* (2013.01); *G06F 1/203* (2013.01); *H05K 7/20154* (2013.01); *F28D 15/0233* (2013.01); *F28D 15/0275* (2013.01)

(58) Field of Classification Search
CPC .. H05K 7/20336; H05K 7/20154; G06F 1/20; G06F 1/203; F28D 15/04; F28D 15/0233; F28D 15/0275
See application file for complete search history.

(56) References Cited

U.S. PATENT DOCUMENTS

| | | | |
|---|---|---|---|
| 7,388,747 B2 * | 6/2008 | Yang ..................... | H01L 23/427 165/80.4 |
| 7,518,868 B2 * | 4/2009 | Farrow ................. | H01L 23/427 174/16.3 |
| 7,965,512 B2 * | 6/2011 | Huang ..................... | F28F 1/24 165/104.33 |
| 8,395,898 B1 * | 3/2013 | Chamseddine ....... | F28D 7/0075 361/695 |
| 10,831,247 B2 * | 11/2020 | Uchino ................... | F28F 3/025 |
| 11,599,168 B2 * | 3/2023 | McKittrick ....... | H01M 10/6563 |

(Continued)

FOREIGN PATENT DOCUMENTS

| | | | |
|---|---|---|---|
| JP | H08227955 A | * | 9/1996 |
| JP | 2009-58213 A | | 3/2009 |

(Continued)

*Primary Examiner* — Zachary Pape
(74) *Attorney, Agent, or Firm* — Osha Bergman Watanabe & Burton LLP

(57) ABSTRACT

An electronic apparatus includes: a heating element; and a plurality of heat pipes that is thermally connected to the heating element. Each of the heat pipes has a cross section having a rectangular shape, a heat receiving surface thermally connected to the heating element, and a side surface orthogonal to the heat receiving surface. The side surfaces of the heat pipes, which are adjacent to each other, are in surface contact with each other.

6 Claims, 6 Drawing Sheets

(56) References Cited

U.S. PATENT DOCUMENTS

| | | | | |
|---|---|---|---|---|
| 11,963,335 B2* | 4/2024 | Paavola | ............... | H05K 1/0203 |
| 2017/0199554 A1* | 7/2017 | Chen | ....................... | H01L 23/38 |
| 2020/0391266 A1* | 12/2020 | Moore | ................. | B21C 35/023 |
| 2021/0059073 A1* | 2/2021 | Patankar | ............... | H01L 23/427 |

FOREIGN PATENT DOCUMENTS

| | | |
|---|---|---|
| JP | 2013-197542 A | 9/2013 |
| JP | 2017-520106 A | 7/2017 |
| JP | 2020-188033 A | 11/2020 |

* cited by examiner

HEAT PIPES OF AN ELECTRONIC APPARATUS AND METHOD OF MANUFACTURING THE SAME

CROSS-REFERENCE TO RELATED APPLICATIONS

This application claims priority to Japanese Patent Application No. 2021-171882 filed on Oct. 20, 2021, the contents of which are hereby incorporated herein by reference in their entirety.

TECHNICAL FIELD

The present invention relates to an electronic apparatus, which includes a heating element and a plurality of heat pipes thermally connected to the heating element, and a method of manufacturing the same.

BACKGROUND

An electronic apparatus includes a heating element such as a CPU or a GPU and needs to dissipate heat from the heating element. Japanese Unexamined Patent Application Publication No. 2020-188033 discloses an invention in which heat generated by a heating element of a computer is transported by a single heat pipe. The heat pipe of the present invention is thermally connected to the heating element, transports the received heat, and exhausts the heat to the outside with a fan.

Although a processing capacity of a laptop-shaped thin electronic apparatus is increasing to the extent that the apparatus is able to be used as so-called a mobile workstation, as the capacity increases, the amount of heat generated also increases, so improvement in cooling performance is required. On the other hand, in the thin electronic apparatus, unlike large machines such as servers, it is desired that a cooling section is also thin due to space restrictions.

It is conceivable that a plurality of heat pipes is used for improving the cooling performance. The plurality of heat pipes is desired to be in surface contact with each other in order to reduce the heat resistance generated from each other. In order to make the plurality of heat pipes be in surface contact with each other, it is conceivable to press a plurality of round or elliptical materials such that the materials is pressed against each other to form a flat surface. However, the materials cannot be formed wide and thin by simply pressing the round or elliptical materials such that the materials are pressed against each other, and it is difficult to apply the materials to the thin electronic apparatus.

SUMMARY

One or more embodiments of the present invention provide an electronic apparatus and a method of manufacturing the same, which can improve cooling performance of a cooling section of a heating element and realize the thinning.

An electronic apparatus according to an aspect of one or more embodiments of the present invention includes: a heating element; and a plurality of heat pipes that is thermally connected to the heating element, in which each of the heat pipes has a cross section having a rectangular shape, a heat receiving surface thermally connected to the heating element, and a side surface orthogonal to the heat receiving surface, and the side surfaces of the heat pipes, which are adjacent to each other, are in surface contact with each other. In the plurality of heat pipes, since the side surfaces that are orthogonal to the heat receiving surface are in surface contact with each other, heat resistance is lowered and cooling performance is improved.

The heat receiving surface may be in direct contact with the heating element. As a result, the heat transfer property with respect to the heating element is improved and the cooling performance is further improved.

In the cross section of the heat pipe, the length of the side surface may be shorter than the length of the heat receiving surface. As a result, the heat pipe can be made thinner.

Cross-sectional areas of the plurality of heat pipes may be different from each other. As a result, the degree of freedom in manufacturing is increased, and it becomes easier to form the heat receiving surface for the heating element to a proper width.

A method of manufacturing an electronic apparatus according to one or more embodiments of the present invention is a method of manufacturing an electronic apparatus that includes a heating element and a plurality of heat pipes that is thermally connected to the heating element, the method includes: a first forming step of forming a primary formed body having a rectangle-shaped cross section by inserting a cylindrical material or an elliptic cylindrical material into a first die, which has a rectangle-shaped cross section and has one side open, and by pressing the cylindrical material or the elliptic cylindrical material, a second forming step of forming the plurality of heat pipes such that side surfaces, which are adjacent to each other and orthogonal to a heat receiving surface with respect to the heating element, are in surface contact with each other by inserting a plurality of the primary formed bodies side by side into a second die, which has a rectangle-shaped cross section and has one side open, such that each one surface of the primary formed body is exposed to an opening side and by pressing the plurality of primary formed bodies at the same time, and an assembly step of assembling the plurality of heat pipes, of which the side surfaces are in surface contact with each other, such that the heat receiving surface is thermally connected to the heating element. As a result, the cooling performance of a cooling section of the heating element can be improved and the thinning can be realized.

In the second forming step, the primary formed body may be pressed while rolling a plurality of rollers, which is arranged in an extending direction of the primary formed body, in the extending direction.

The above-described aspects of the present invention can form a heat pipe that is the final product into a wide and thin proper rectangular shape because an intermediate body is formed in a rectangular shape in a first forming step. Further, in the obtained plurality of heat pipes, since side surfaces that are orthogonal to a heat receiving surface are in proper surface contact with each other, heat resistance is lowered and cooling performance is improved.

BRIEF DESCRIPTION OF THE DRAWINGS

FIG. 6A is a schematic cross-sectional view illustrating a material of the heat pipe, FIG. 6B is a schematic cross-sectional view for describing a first forming step, FIG. 6C is a schematic cross-sectional view for describing a second forming step, and FIG. 6D is a schematic cross-sectional view in a state in which the second forming step is ended.

DETAILED DESCRIPTION

Hereinafter, one or more embodiments of an electronic apparatus and a method of manufacturing the same according to one or more embodiments of the present invention will be described in detail with reference to the drawings. Note that, the present invention is not limited to these embodiments.

Figure 1:
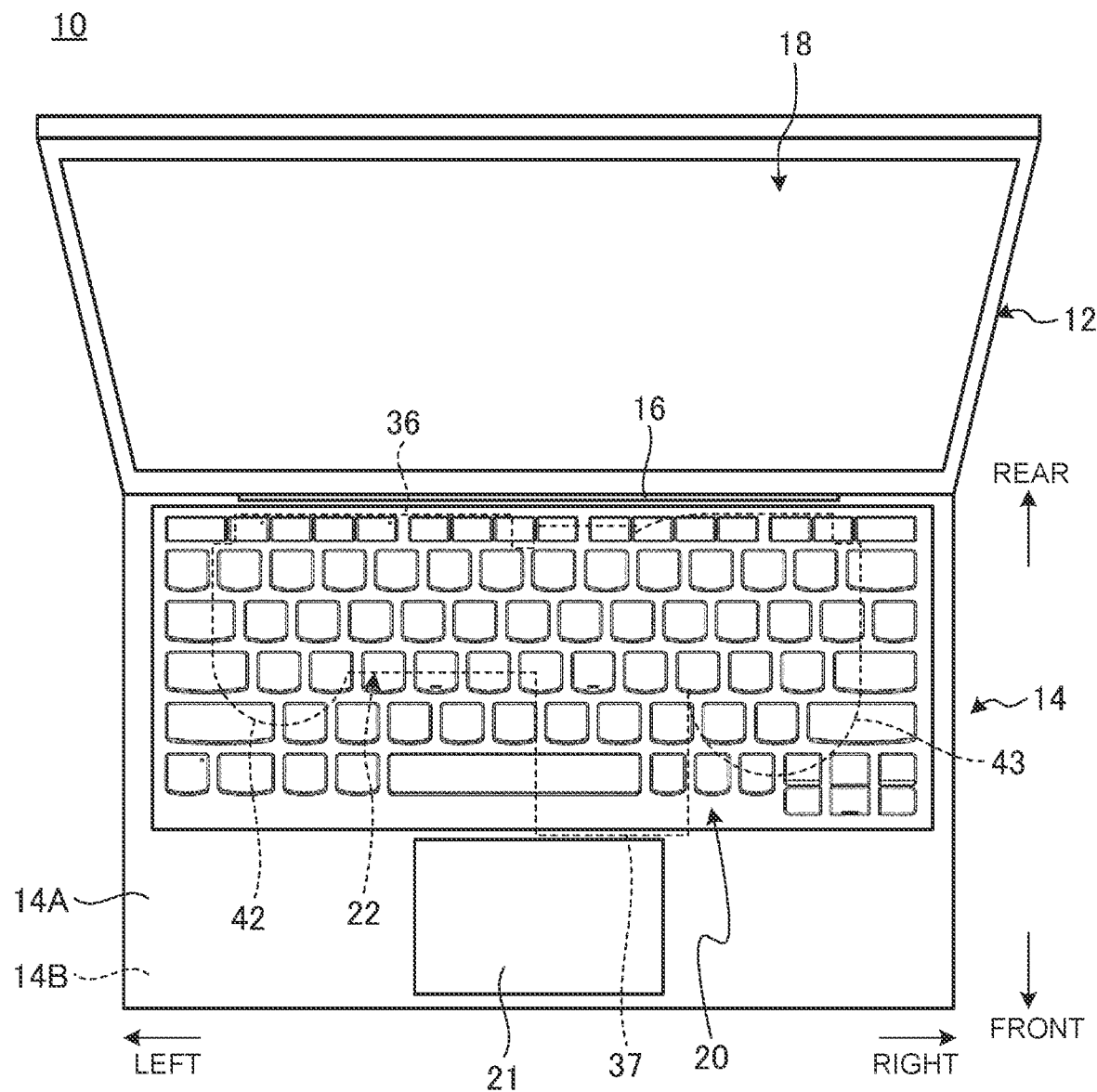
FIG. 1 is a schematic plan view of an electronic apparatus according to one or more embodiments as viewed from above.

FIG. 1 is a schematic plan view of an electronic apparatus 10 according to one or more embodiments as viewed from above. As illustrated in FIG. 1, the electronic apparatus 10 is a clamshell-shaped laptop PC in which a display chassis 12 and a chassis 14 are relatively and rotatably connected by a hinge 16, and is a so-called mobile workstation. The electronic apparatus according to the present invention may be, for example, a desktop PC, a tablet PC, a portable phone, a smartphone, a game machine, or the like, other than a laptop PC.

The display chassis 12 is a thin flat box. A display 18 is mounted on the display chassis 12. The display 18 is adapted to, for example, an organic EL (OLED: Organic Light Emitting Diode) or a liquid crystal.

Hereinafter, the chassis 14 and each element mounted on the chassis 14 will be described such that a space between the chassis 12 and 14 is set as being open as illustrated in FIG. 1, a posture for visually recognizing the display 18 is set as a reference, a front side is set as a front, a rear side is set as a rear, a width direction is set as left and right, and a height direction (a thickness direction of chassis 14) is set as top and bottom.

The chassis 14 is a thin flat box. The chassis 14 is adapted to a cover member 14A, which forms a top surface and four peripheral side surfaces, and a cover member 14B, which forms a bottom surface. The top cover member 14A has a substantially bathtub shape in which a bottom surface is open. The bottom cover member 14B has a substantially flat plate shape and serves as a lid that closes the bottom surface opening of the cover member 14A. The cover members 14A and 14B are overlapped in the thickness direction and are connected to each other in an attachable and detachable manner. A keyboard 20 and a touch pad 21 are provided on the top surface of the chassis 14. A rear end part of the chassis 14 is connected to the display chassis 12 by using the hinge 16.

Figure 2:
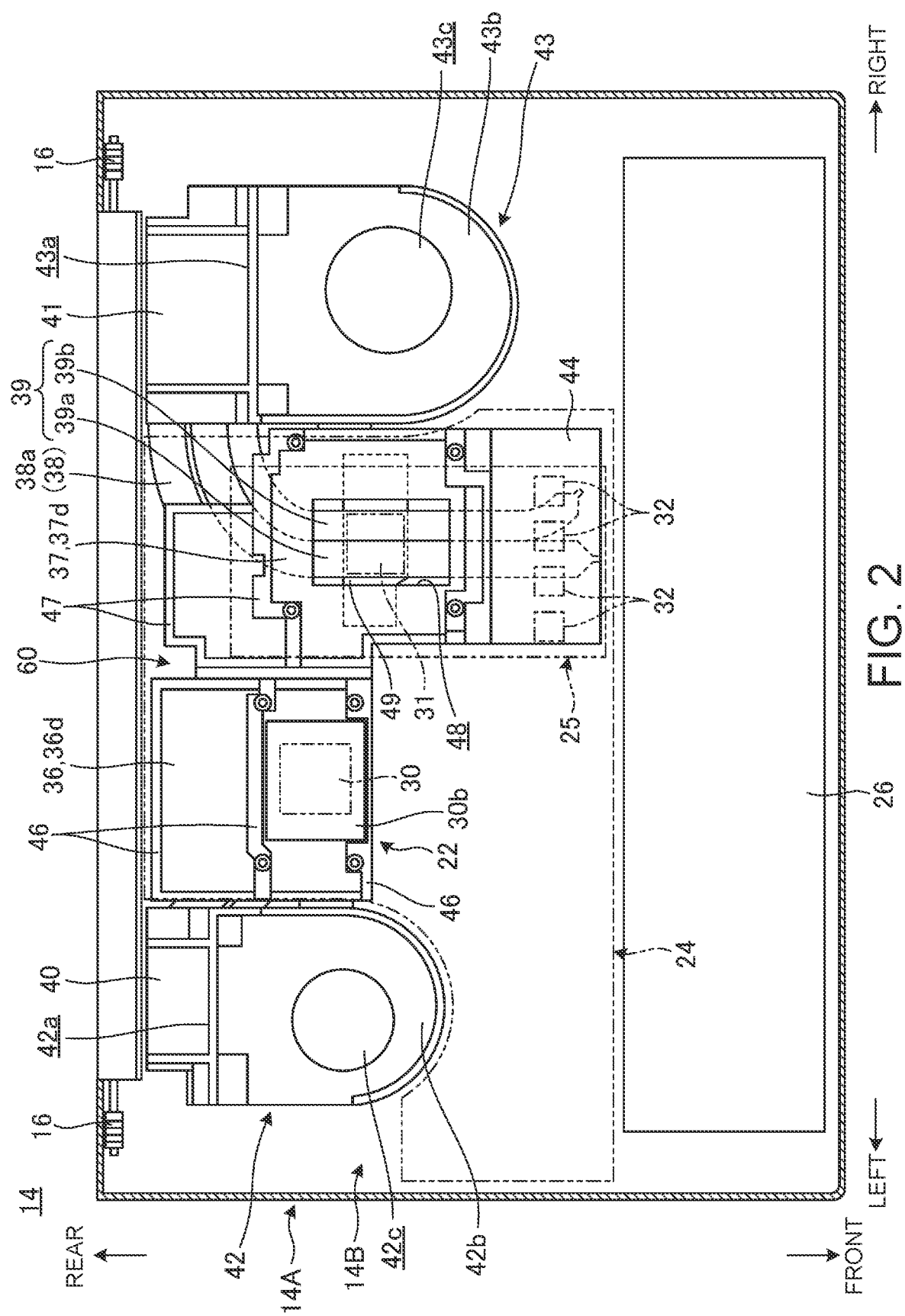
FIG. 2 is a plan view schematically illustrating an internal structure of a chassis.

FIG. 2 is a plan view schematically illustrating an internal structure of the chassis 14 and is a schematic plan cross-sectional view of the chassis 14 cut slightly below the keyboard 20.

As illustrated in FIG. 2, a cooling module 22, a motherboard 24, a sub-board 25, and a battery device 26 are provided inside the chassis 14. Various electronic components, mechanical components, and the like are further provided inside the chassis 14.

The motherboard 24 is a main board of the electronic apparatus 10. The motherboard 24 is disposed closer to the rear of the chassis 14 and extends along the horizontal direction. The motherboard 24 is a printed substrate on which various electronic components such as a communication module, a memory, and a connection terminal are mounted in addition to a central processing unit (CPU) 30. The motherboard 24 is disposed under the keyboard 20 and is screwed to a back surface of the keyboard 20 and an inner surface of the cover member 14A. A top surface of the motherboard 24 is an attaching surface for the cover member 14A, and a bottom surface is a mounting surface for the CPU 30 and the like. The CPU 30 is disposed substantially at the center of the left and right sides of the mounting surface of the motherboard 24. The CPU 30 performs computing related to primary control or processing of the electronic apparatus 10.

Figure 5:
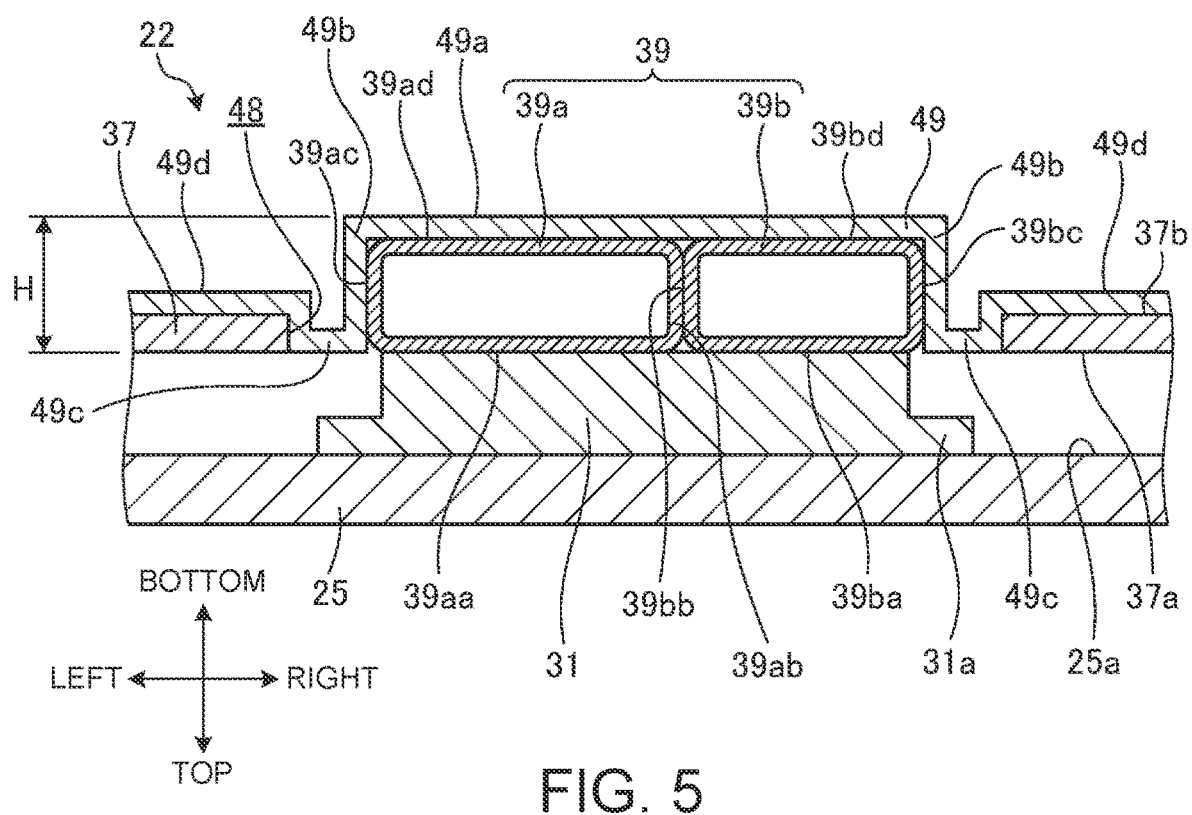
FIG. 5 is a schematic cross-sectional side view of the cooling module and a GPU.

The sub-board 25 is an expansion card having a smaller outer shape than that of the motherboard 24. The sub-board 25 is a printed substrate on which various electronic components such as a graphics processing unit (GPU) 31 or a power component 32 are mounted. The sub-board 25 is laminated in the vicinity of a right end of the mounting surface of the motherboard 24 (see FIG. 2), and the GPU 31 is mounted substantially in the center of the sub-board 25. The sub-board 25 is connected to a connector mounted on the motherboard 24, thereby the sub-board 25 is electrically connected to the motherboard 24. A top surface of the sub-board 25 is an attaching surface with respect to the mounting surface of the motherboard 24, and a bottom surface is a mounting surface 25a (see FIG. 5) for the GPU 31 and the like. The GPU 31 performs computing necessary for image depiction such as 3D graphics. The reference numeral 31a in FIG. 5 is a package substrate on which the GPU (die) 31 is mounted.

The battery device 26 is a rechargeable battery that serves as a power source for the electronic apparatus 10. The battery device 26 is disposed in front of the motherboard 24 and extends to the left and right along a front end part of the chassis 14.

The CPU 30 and the GPU 31 are heating elements having the largest amount of heat generated among the electronic components mounted in the chassis 14. The cooling module 22 absorbs and diffuses heat generated by the CPU 30 and the GPU 31 and further discharges the heat to the outside of the chassis 14. The cooling module 22 is laminated on the bottom surfaces of the motherboard 24 and the sub-board 25.

Figure 3:
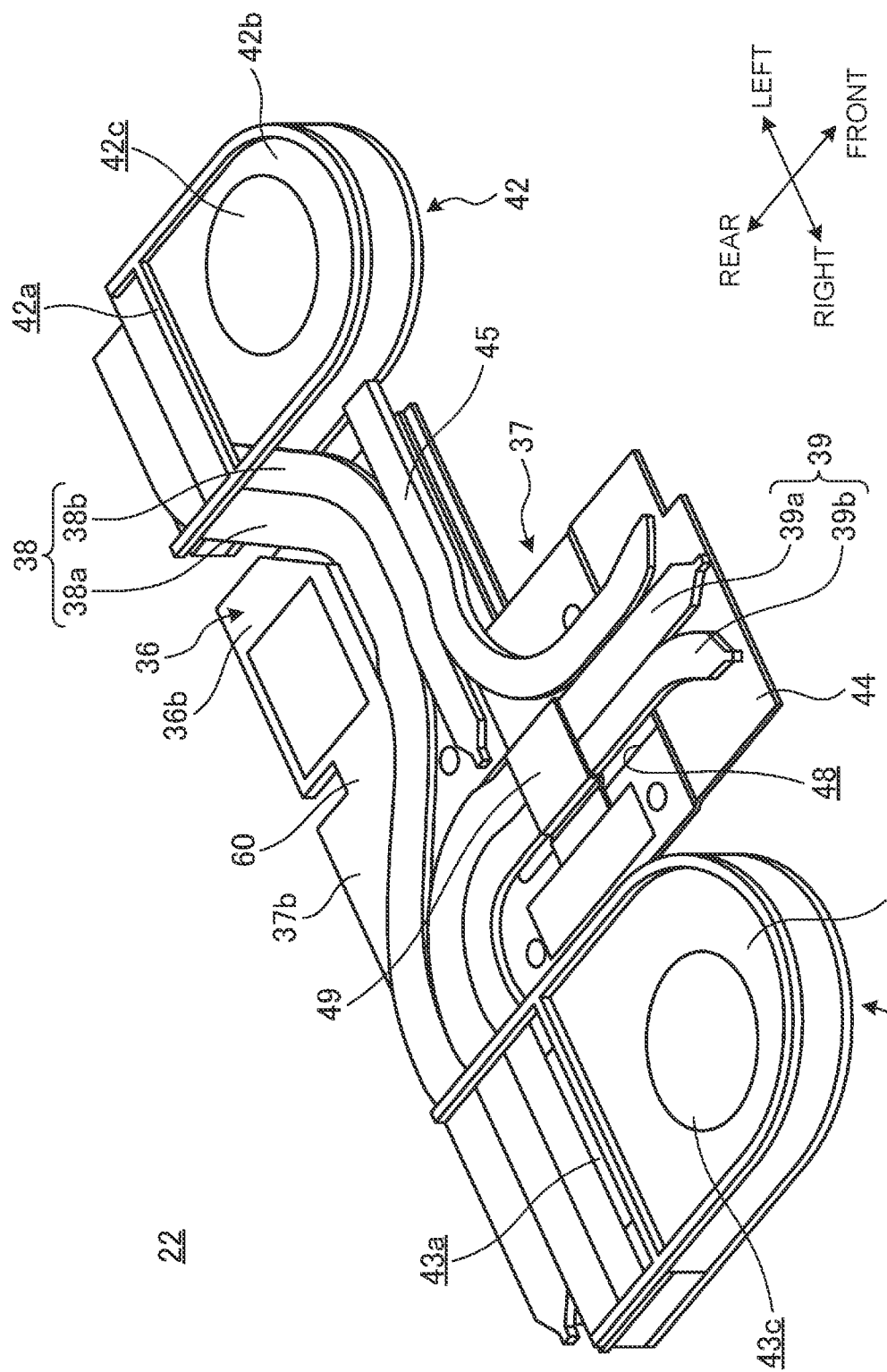
FIG. 3 is a perspective view of a cooling module.

FIG. 3 is a schematic bottom surface view of the cooling module 22.

As illustrated in FIGS. 2 and 3, the cooling module 22 includes vapor chambers 36 and 37 arranged on the left and right, a heat pipe 38 configured with a set of two, a heat pipe 39 configured with a set of two, one heat pipe 45 (see FIG. 3), a pair of left and right cooling fins 40 and 41, a pair of left and right air blowing fans 42 and 43, and a heat conduction plate 44.

The vapor chambers 36 and 37 are plate-shaped heat transport devices. In the vapor chamber 36, a closed space is formed between two thin metal plates, and working fluid is enclosed in the closed space. The metal plate is made of a metal with high heat conductivity, such as aluminum, copper, or stainless steel. The closed space S1 is a flow path through which the enclosed working fluid flows while creating a phase change. Examples of the working fluid include water, CFC substitutes, acetone, butane, and the like. Inside the closed space, a wick that sends the condensed working fluid by using the capillarity phenomenon is provided. The wick is formed of, for example, a porous body such as a mesh in which fine metal wires are woven into a cotton shape or a fine flow path.

The vapor chamber 37 has the same basic configuration as the vapor chamber 36 described above, except that an outer shape is larger than that of the vapor chamber 36 and the plate thickness is slightly thinner. That is, in the vapor chamber 37, a closed space is formed between two thin metal plates, a wick is provided in the closed space S2, and a working fluid is enclosed. In the vapor chamber 37, the material of the metal plate, the type of the working fluid, the configuration of the wick, and the like may be the same as those of the vapor chamber 36 described above. A notch 48 having a rectangular shape is formed in a peripheral portion of the GPU 31 in the vapor chamber 37.

The vapor chambers 36 and 37 are thin and easily deformed. Therefore, the vapor chambers 36 and 37 are reinforced by bonding frames 46 and 47 to outer peripheral edge parts or central parts of the top surfaces 36a and 37a, respectively (see FIG. 2). The frames 46 and 47 are made of a metal such as stainless steel and are formed in a frame shape by a rod body thicker than the vapor chambers 36 and 37.

The heat pipe 38 is a pipe-shaped heat transport device. In the present embodiment, two heat pipes 38a and 38b are used in parallel in a set of two in front and rear, but one or three or more heat pipes may be used. The heat pipes 38a and 38b are formed by crushing a metal pipe thinly and flatly into an elliptical cross section shape, and a working fluid is enclosed in a closed space formed in the metal pipe. The metal pipe is made of a metal with high heat conductivity, such as aluminum, copper, or stainless steel. The closed space is a flow path through which the enclosed working fluid flows while creating a phase change. Examples of the working fluid include water, CFC substitutes, acetone, butane, and the like. Inside the closed space, a wick that sends the condensed working fluid by using the capillarity phenomenon is provided. The wick is formed of, for example, a porous body such as a mesh in which fine metal wires are woven into a cotton shape or a fine flow path.

The heat pipes 39 and 45 have the same basic configuration as the heat pipe 38 described above, except that the length and the path are different. That is, the heat pipes 39 and 45 are formed by providing a wick in a closed space inside a flatly crushed metal pipe and enclosing a working fluid. Further, the heat pipe 39 uses two heat pipes 39a and 39b in parallel in a set of two in front and rear or left and right but may use one or three or more heat pipes. In the heat pipe 39, the material of the metal pipe, the type of the working fluid, the configuration of the wick, and the like may be the same as those of the heat pipe 38 described above. The configuration, action, and manufacturing method of the heat pipes 39a and 39b will be further described later.

As illustrated in FIGS. 2 and 3, the cooling fin 40 on the left has a structure in which a plurality of plate-shaped fins is arranged at equal intervals in the horizontal direction on a surface of the plate. Each fin stands in the vertical direction and extends in the front and rear direction. A gap, through which the air that is sent from the air blowing fan 42 passes, is formed between the fins adjacent to each other. The cooling fin 40 is made of a metal having a high heat conductivity such as aluminum or copper.

Since the cooling fin 41 on the right is symmetrical with the cooling fin 40 on the left, as the basic configuration, even though the size or the like is slightly different, detailed description will be omitted.

As illustrated in FIGS. 2 and 3, the air blowing fan 42 on the left is disposed immediately in front of the cooling fin 40. That is, the cooling fin 40 is disposed facing an exhaust port 42a opened rearward of the air blowing fan 42. The air blowing fan 42 is a centrifugal fan that rotates an impeller housed inside the fan chassis 42b by a motor. The air blowing fan 42 discharges the air, which is sucked from intake ports 42c opened on the top and bottom surfaces of the fan chassis 42b, in the chassis 14 from the exhaust port 42a. The air blowing from the exhaust port 42a passes through the cooling fin 40 and promotes heat dissipation.

Since the air blowing fan 43 on the right is symmetrical with the air blowing fan 42 on the left, as the basic configuration, even though the size or the like is slightly different, detailed description will be omitted. That is, the air blowing fan 43 also has a rearward-facing exhaust port 43a and an intake port 43c opened on the top and bottom surfaces of the fan chassis 43b. The cooling fin 41 is disposed to face the exhaust port 43a of the air blowing fan 43.

In the cooling module 22 configured as described above, the top surface 36d of the vapor chamber 36 abuts the CPU 30 via a heat receiving plate. Further, the vapor chamber 37 is formed with the notch 48 as described above, and the heat pipe 39 direct abuts the GPU 31 through the notch 48.

The central part of the heat pipe 38 is curved to the front and extends in the horizontal direction as a whole. The heat pipe 38 is bonded to the bottom surface 36e of the vapor chamber 36 at a position where the substantially central part, which is a heat receiving part, overlaps with the CPU 30. The left end part of one heat pipe 38a is bonded to the bottom surface of the cooling fin 40, and the right end part of the one heat pipe 38a passes over a bridge part 60 and is bonded to the bottom surface 37b of the vapor chamber 37. The left end part of the other heat pipe 38b is bonded to the bottom surface of the cooling fin 40, and the right end part of the other heat pipe 38b passes over the bridge part 60, passes through the bottom surface 37b of the vapor chamber 37, and is bonded to the bottom surface of the cooling fin 41. Most portion of the heat pipe 38 is bonded to the bottom surfaces 36b and 37b of each of the vapor chambers 36 and 37.

The heat pipe 39 is disposed in a substantially L shape as a whole. The heat pipe 39 is bonded to the bottom surface 37b of the vapor chamber 37 at a position where the substantially central part, which is a heat receiving part, overlaps with the GPU 31. The right end part of the heat pipe 39 is bonded to the bottom surface of the cooling fin 41, and the front end part of the heat pipe 39 passes through the vapor chamber 37 and is bonded to the bottom surface of the heat conduction plate 44. The two heat pipes 39a and 39b follow substantially the same path in parallel. Most portion of the heat pipe 39 is bonded to the bottom surface 37b of the vapor chamber 37. The heat pipe 45 is disposed in a substantially L shape as a whole and is in contact with the heat pipe 38b and the heat pipe 39a. By interposing the heat pipe 45, the heat resistance between the heat pipe 38b and the heat pipe 39a is reduced, and a cooperative cooling action can be obtained.

As a result, the heat, which is generated by the CPU 30 and GPU 31, is absorbed and diffused in the vapor chambers 36 and 37 and the heat pipe 39, and is efficiently transported to the cooling fins 40 and 41 via the heat pipes 38, 39, and 45, and then is discharged to the outside of the chassis 14 by the air blowing from the air blowing fans 42 and 43. Note that, in the present embodiment, the vapor chambers 36 and 37 are connected by the bridge part 60, but the vapor chambers 36 and 37 may be independent of each other.

Figure 4:
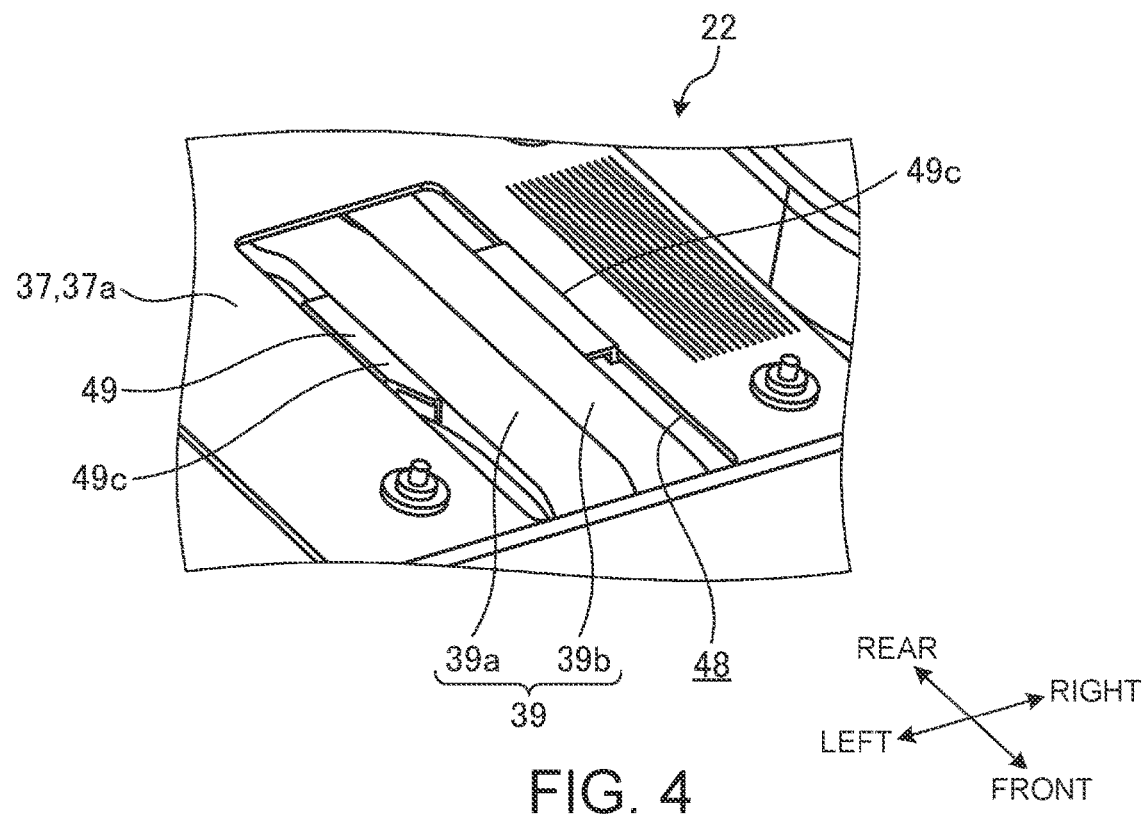
FIG. 4 is a partially enlarged perspective view of the cooling module viewed from a side opposite to FIG. 3.

Next, the configuration and the action and effect of the heat pipe 39 will be further described. FIG. 4 is a partially enlarged perspective view of the cooling module 22 viewed from a side opposite to FIG. 3. FIG. 5 is a schematic cross-sectional side view of the cooling module 22 and a GPU 31.

As illustrated in FIGS. 4 and 5, the heat pipes 39a and 39b are adjacent to and parallel to each other in the horizontal direction and each of cross sections has a rectangular shape. In this embodiment, the heat pipe 39a has a larger cross-sectional area than that of the heat pipe 39b. The heat pipes 39a and 39b are put together with a fixture 49.

In a cross-sectional shape of the heat pipe 39a, the lengths of the side surfaces 39ab and 39ac are shorter than those of the top surface 39aa and the bottom surface 39ad which are the heat receiving surfaces, and the height H including the fixture 49 is set low. The fixture 49 is sufficiently thinner than the heat pipes 39a and 39b, and substantially occupied by the heat pipes 39a and 39b in terms of the height H. In a cross-sectional shape of the heat pipe 39b, the lengths of the side surfaces 39bb and 39bc are shorter than those of the top surface 39ba and the bottom surface 39bd which are the heat receiving surfaces, and the height H including the fixture 49 is set low. The heights of the heat pipe 39a and the heat pipe 39b in the vertical direction are the same. Hereinafter, the top surfaces 39aa and 39ba are also referred to as heat receiving surfaces 39aa and 39ba.

The heat pipe 39a has a rectangle-shaped cross section, and the heat receiving surface 39aa and the bottom surface 39ad, and the side surfaces 39ab and 39ac are orthogonal to each other. The heat pipe 39b has a rectangle-shaped cross section, and the top surface 39ba and the bottom surface 39bd, and the side surfaces 39bb and 39bc are orthogonal to each other.

The heat pipes 39a and 39b are slightly upward such that the heat pipes 39a and 39b enter the notch 48 at a location of the notch 48, and the heat receiving surfaces 39aa and 39ba are in direct contact with the GPU 31. Since the heat receiving surfaces 39aa and 39ba are in direct contact with the GPU 31, good heat transfer property is provided. However, the direct contact here includes the interposition of grease or the like having substantially no thickness. The heat pipes 39a and 39b are wide in the horizontal direction and are in contact with the entire bottom surface of the GPU 31. The side surface of the heat pipe 39a and the side surface of heat pipe 39b, which face each other, are in surface contact with each other, that is, the side surface 39ab and the side surface 39bb are in surface contact with each other.

The fixture 49 is formed, for example, by performing a bending process on a metal plate and includes a crossing part 49a, a pair of vertical walls 49b, a pair of fold back parts 49c, and a pair of fixing pieces 49d. The crossing part 49a abuts the bottom surfaces 39ad and 39bd such that the crossing part 49a crosses the heat pipes 39a and 39b. The vertical wall 49b abuts the side surfaces 39ac and 39bc such that the vertical wall 49a suppresses the heat pipes 39a and 39b from both the left and right sides. That is, the crossing part 49a and the vertical wall 49b have a U-shaped cross section, and the heat pipes 39a and 39b are bundled and fixed.

The fold back part 49c is connected from the end part of the vertical wall 49b, slightly enters the notch 48, and is positioned such that the heat receiving surfaces 39aa and 39ba of the heat pipes 39a and 39b abut the GPU 31. The fixing piece 49d is connected from the end part of the vertical wall 49b and abuts and is fixed to the bottom surface 37b of the vapor chamber 37. The fixing piece 49d and the vapor chamber 37 are fixed by welding or adhesion. The fixture 49 has even higher strength when the fixture 49 is die-cast formed and when a location corresponding to the fold back part 49c is made into a thick wall shape without folding back. Further, the fixing piece 49d may abut and be fixed to the top surface 37a without the fold back part 49c.

According to the cooling module 22 of the electronic apparatus 10 configured in this way, the two heat pipes 39a and 39b are in direct contact with the entire bottom surface of the GPU 31, and the cooling performance is improved as compared with a case where one heat pipe is used. The heights H of the heat pipes 39a and 39b and the fixture 49 are sufficiently low, and the electronic apparatus 10 can be made thinner.

The heat pipe 39a and the heat pipe 39b are in surface contact with each other on the side surface 39ab and the side surface 39bb, and act in cooperation with each other because the heat resistance of each other is low, thereby well-balanced heat dissipation is performed without biasing the heat load to either one. The two heat pipes 39a and 39b can be easily formed to bend toward the cooling fin 41 (see FIG. 2) as compared with a case where one thick heat pipe is used.

Further, since the heat pipe 39b has a smaller cross-sectional area than that of the heat pipe 39a, the heat pipe 39b is easy to bend, thereby the heat pipe 39b is provided inwardly having a large curvature at a location where the heat pipe 39b bends toward the cooling fin 41. By making the heat pipe 39a and the heat pipe 39b have different cross-sectional areas, it is easy to match the width of the GPU 31 to be contacted.

However, depending on the design conditions, the cross-sectional areas of the heat pipe 39a and the heat pipe 39b may be the same. The number of heat pipes 39 in contact with the GPU 31 may be three or more. A similar structure in which the heat pipes 39a and 39b are in contact with the GPU 31 from the notch 48 may be applied to a heat transfer part between the CPU 30 and the heat pipes 38a and 38b.

Figure 6A:
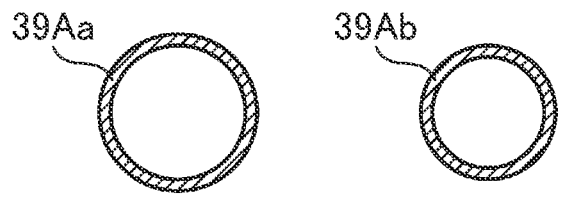
FIGS. 6A to 6D are views describing a manufacturing step of a heat pipe.
Figure 6B:
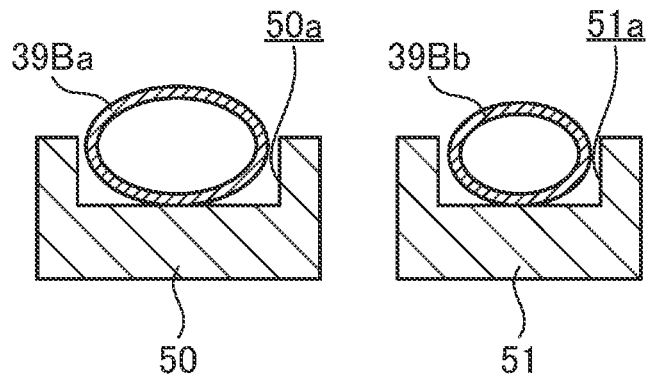
Figure 6C:
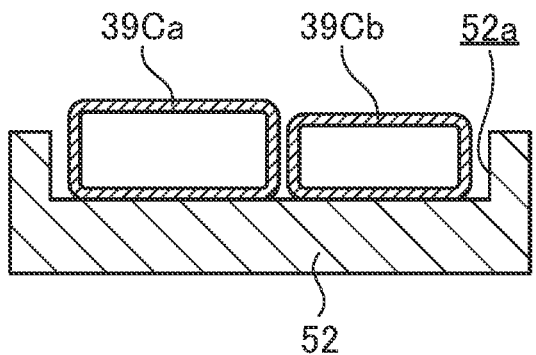
Figure 6D:
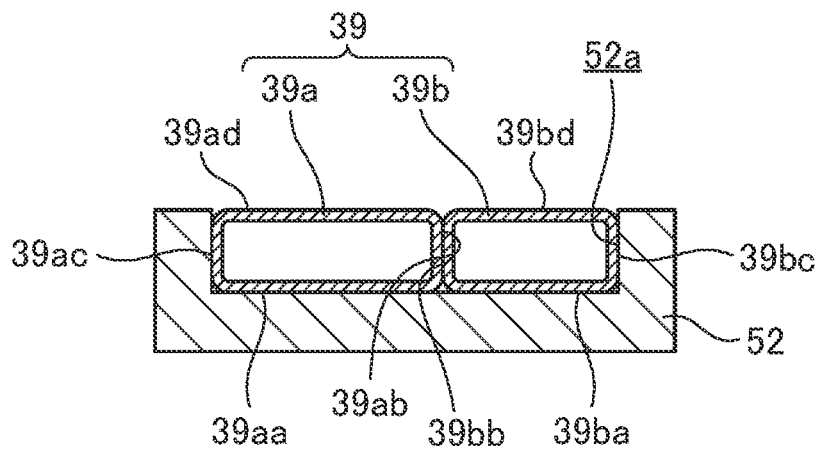
Figure 7:
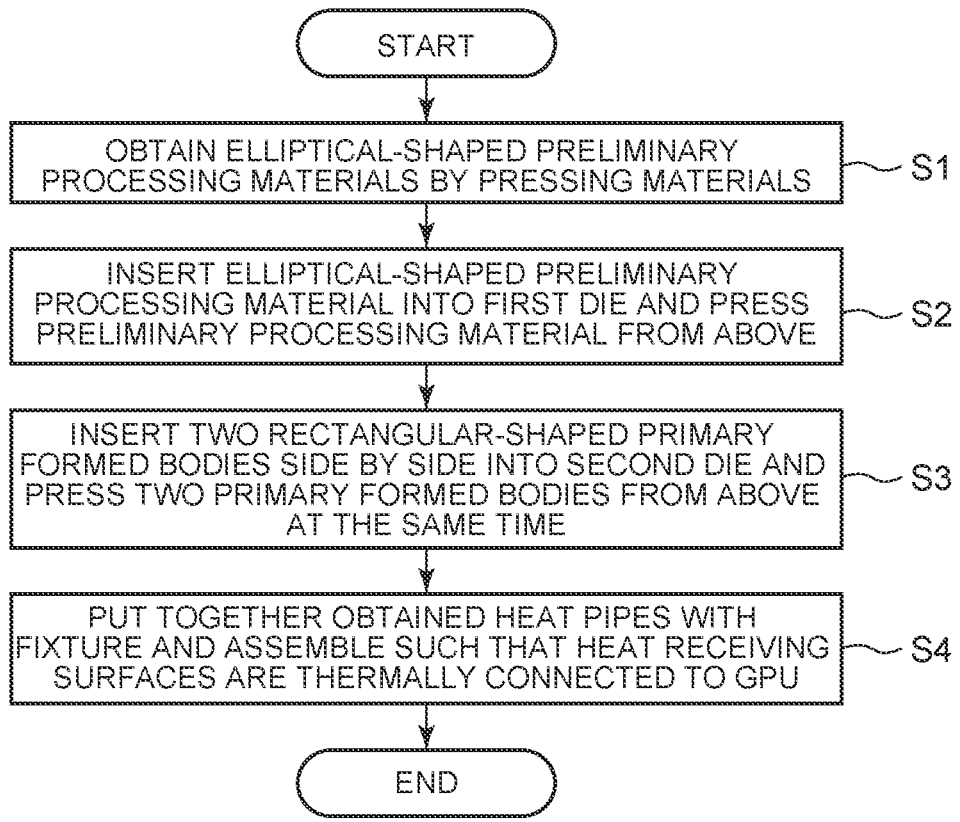
FIG. 7 is a flowchart illustrating a method of manufacturing the heat pipe.
Figure 8:
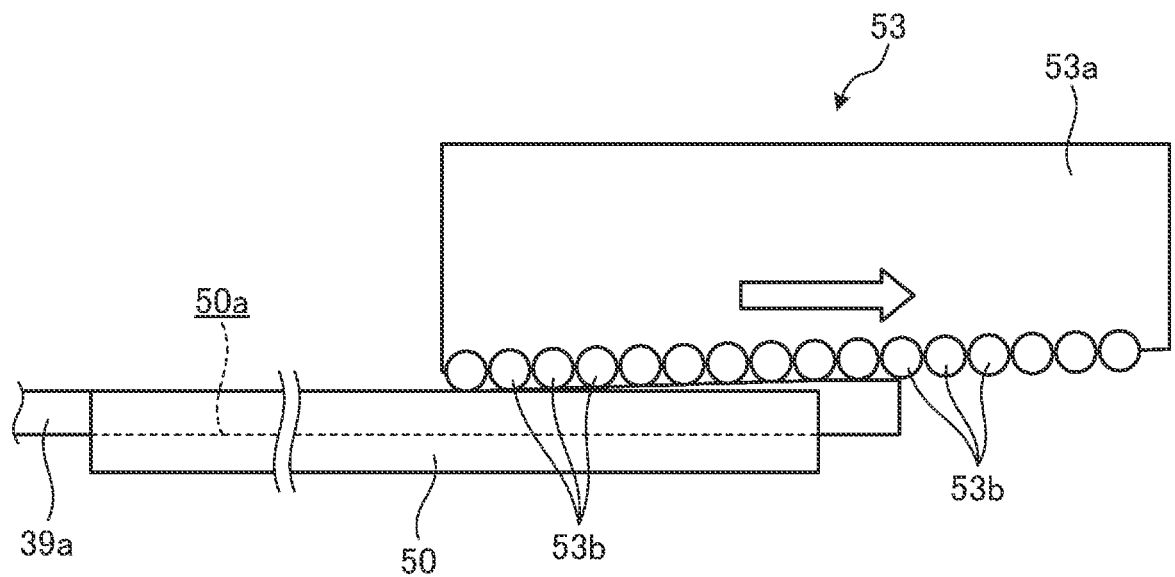
FIG. 8 is a schematic side view for describing the first forming step.

Next, regarding the method of manufacturing the electronic apparatus 10, particularly the method of manufacturing the heat pipes 39a and 39b will be described. FIGS. 6A to 6D are views describing the manufacturing step of the heat pipes 39a and 39b, FIG. 6A is a schematic cross-sectional view illustrating materials 39Aa and 39Ab of the heat pipes 39a and 39b, FIG. 6B is a schematic cross-sectional view for describing a first forming step, FIG. 6C is a schematic cross-sectional view for describing a second forming step, and FIG. 6D is a schematic cross-sectional view in a state in which the second forming step is ended. FIG. 7 is a flowchart illustrating the method of manufacturing the heat pipes 39a and 39b. FIG. 8 is a schematic side view for describing a first forming step.

The heat pipes 39a and 39b are manufactured by using the cylindrical materials 39Aa and 39Ab as illustrated in FIG. 6A. The material 39Aa of the heat pipe 39a has a slightly larger cross-sectional area than that of the material 39Ab of the heat pipe 39b. A predetermined amount of wick is put in each of the materials 39Aa and 39Ab.

In step S1 of FIG. 7, each of perfect circular materials 39Aa and 39Ab is pressed by a predetermined section to obtain elliptical-shaped preliminary processing materials 39Ba and 39Bb (see FIG. 6B).

In step S2 (the first forming step), the elliptical-shaped preliminary processing material 39Ba is inserted into a rectangular groove 50a of a first die 50, and the preliminary processing material 39Bb is inserted into a rectangular groove 51a of a first die 51, and then each of the preliminary processing materials 39Ba and 39Bb is pressed from above. The first dies 50 and 51 have the substantially same length as the preliminary processing materials 39Ba and 39Bb, respectively. The rectangular grooves 50a and 51a are formed along the long-length direction of the first dies 50 and 51 and are open upward.

The horizontal width of the rectangular groove 50a is slightly larger than the horizontal width of the elliptical-shaped preliminary processing material 39Ba (length in the longitudinal direction in FIGS. 6A to 6D), and the depth is slightly shallower than the height of the preliminary processing material 39Ba (length in the short-length direction in FIGS. 6A to 6D). The horizontal width of the rectangular groove 51a is slightly larger than the horizontal width of the elliptical-shaped preliminary processing material 39Bb (length in the longitudinal direction in FIGS. 6A to 6D), and the depth is slightly shallower than the height of the preliminary processing material 39Bb (length in the short-length direction in FIGS. 6A to 6D).

Step S2 is performed by using the pressing machine 53 as illustrated in FIG. 8. The pressing machine 53 has a die 53a which is a main body and a plurality of rollers 53b provided on the bottom surface of the die 53a. The die 53a is a block having a moderate weight. The plurality of rollers 53b are provided on the bottom surface of the die 53a at narrow intervals. Each roller 53b is rotatable about an axis orthogonal to a direction in which the pressing machine 53 is moved (the direction of the arrow in FIG. 8).

The pressing machine 53 is moved along the long-length direction of the first die 50 by a manual operation or a predetermined driving machine in a state in which the pressing machine 53 is placed on the top surface of the first die 50. As the pressing machine 53 moves, the roller 53b presses a portion of the preliminary processing material 39Ba that protrudes from the rectangular groove 50a. The preliminary processing material 39Ba is formed in the same rectangular shape as the rectangular groove 50a by the plurality of rollers 53a pressing the preliminary processing material 39Ba while rolling, and then a primary formed body 39Ca (see FIG. 6C) is obtained.

Although not illustrated, the elliptical-shaped preliminary processing material 39Bb that is inserted into the rectangular groove 51a of the first die 51 is also formed in the same rectangular shape as the rectangular groove 51a by the pressing machine 53, and the primary formed body 39Cb (see FIG. 6C) is obtained. However, the primary formed bodies 39Ca and 39Cb are not limited to a rectangular shape having four right-angled parts in a strict sense, and may be a substantially rectangular shape such that corner parts have a small chamfered shape, for example. The preliminary processing materials 39Ba and 39Bb may be pressed by the weight of the pressing machine 53, or may be pressed by a combination of predetermined pressurizing sections. Further, step S1 may be omitted and the perfect circular-shaped material may be directly inserted into the first dies 50 and 51 and pressed by the pressing machine 53, but higher dimensional accuracy can be obtained by performing the preliminary processing on the material into an elliptical shape in step S1 once (or a plurality of times).

In step S3 (the second forming step), two rectangular-shaped primary formed bodies 39Ca and 39Cb are inserted side by side into the rectangular groove 52a of a second die 52, and the two primary formed bodies 39Ca and 39Cb are pressed from above at the same time. The second die 52 has the same length as that of the primary formed bodies 39Ca and 39Cb. The rectangular groove 52a is formed along the long-length direction of the second die 52 and opens upward.

The horizontal width of the rectangular groove 52a is slightly larger than the combined horizontal width of the two rectangular-shaped primary formed bodies 39Ca and 39Cb, and the depth is shallower than the depths of any of the primary formed bodies 39Ca and 39Cb. As illustrated in FIG. 6C, the rectangular-shaped primary formed bodies 39Ca and 39Cb are placed horizontally and are arranged side by side in the rectangular groove 52a in the horizontal width direction, and each one surface is exposed to an opening side.

In the same manner as in step S2 above, the primary formed bodies 39Ca and 39Cb are pressed from above at the same time by the pressing machine 53. The primary formed bodies 39Ca and 39Cb are formed in the same rectangular shape as the rectangular groove 52a (see FIG. 6D) by the plurality of rollers 53a pressing the primary formed bodies 39Ca and 39Cb while rolling, and then the heat pipes 39a and 39b are obtained. The heat pipes 39a and 39b are not limited to a rectangular shape having four right-angled parts in a strict sense, and may be a substantially rectangular shape such that corner parts have a small chamfered shape, for example.

As illustrated in FIG. 6D, the side surfaces 39ab and 39bb of the obtained heat pipes 39a and 39b are in surface contact with each other with substantially no gap. This is because the two rectangular-shaped primary formed bodies 39Ca and 39Cb are arranged in the rectangular groove 52a and pressed at the same time. When step S2 is omitted and the two circular or elliptical intermediate bodies are formed by the second die 52, the amount of processing deformation becomes large, and it is difficult to form the heat pipes 39a and 39b into a proper rectangular shape. In contrast to this, in the present embodiment, since the intermediate bodies are formed in a rectangular shape by the preliminary processing in step S2, the heat pipes 39a and 39b that are the final products can be formed in a wide and thin proper rectangular shape.

Further, since the rectangular groove 52a has a rectangle-shaped cross section, the four side surfaces 39ab, 39ac, 39bb, and 39bc are formed such that the four side surfaces 39ab, 39ac, 39bb, and 39bc are orthogonal to the heat receiving surfaces 39aa, 39ba, respectively, and each of the heat pipes 39a and 39b also has a proper rectangular shape. That is, the cross sections of the heat pipes 39a and 39b do not have a locally narrowed or distorted shape, and the internal wick is not damaged. Further, local excessive strain stress does not remain. Note that, an intermediate forming step may be interposed between step S1 and step S2.

In step S4 (an assembly step), the heat pipes 39a and 39b obtained as described above are put together with the fixture 49, are fixed to the vapor chamber 37, and assembled such that the heat receiving surfaces 39aa and 39ba are thermally connected to the GPU 31.

The heat pipes 39a and 39b manufactured in this manner are widely and thinly formed and can be suitably applied to a thin electronic apparatus 10.

The present invention is not limited to the above-described embodiment, and it is needless to say that the present invention can be freely changed without departing from the gist of the present invention.

DESCRIPTION OF SYMBOLS 10 electronic apparatus
22 cooling module 36, 37 vapor chamber
38, 38a, 38b, 39, 39a, 39b, 45 heat pipe
39aa, 39ba top surface (heat receiving surface)
39Aa, 39Ab material
39Ba, 39Bb preliminary processing material
39Ca, 39Cb primary formed body
48 notch
49 fixture
50, 51 first die
50a, 51a rectangular groove
52 second die
52a rectangular groove
53 pressing machine

What is claimed is:

1. An electronic apparatus comprising:
a heating element; and
a plurality of heat pipes that is thermally connected to the heating element, wherein each of the heat pipes has
a cross section having a rectangular shape,
a heat receiving surface thermally connected to the heating element, and
a side surface orthogonal to the heat receiving surface,
the side surfaces of the heat pipes, which are adjacent to each other, are in surface contact with each other,
cross-sectional areas of the plurality of heat pipes are different from each other,
the cross-sectional areas of the plurality of heat pipes decrease in a direction of a planar bend such that:
the heat pipe with the lowest cross-sectional area has the highest curvature in the planar bend; and
the heat pipe with the highest cross-section area has the lowest curvature in the planar bend,
the electronic apparatus further comprises:
a fixture that is thermally connected to and holds the plurality of heat pipes in a region that overlaps the heating element in a first direction perpendicular to the heat receiving surfaces of the heat pipes; and
a vapor chamber that is thermally connected to the fixture,
the vapor chamber includes an indent that corresponds to a location of the heating element, and
the heat pipes are bent such that the heat receiving surfaces of the heat pipes are thermally connected to the heating element in the indent.

2. The electronic apparatus according to claim 1, wherein the heat receiving surface is in direct contact with the heating element.

3. The electronic apparatus according to claim 1, wherein in the cross section of the heat pipe, a length of the side surface is shorter than a length of the heat receiving surface.

4. The electronic apparatus according to claim 1, wherein the fixture includes:
a crossing part that abuts surfaces of the heat pipes that are opposite to the heat receiving surfaces, where the crossing part overlaps the indent in the first direction;
vertical walls that abut outermost side surfaces of the heat pipes, where the vertical walls overlap the indent in the first direction; and
fixing pieces that are fixed to the vapor chamber, where the fixing pieces extend, from the vertical walls, out of the indent to at least partially overlap the vapor chamber in the first direction.

5. A method of manufacturing an electronic apparatus that includes a heating element and a plurality of heat pipes that is thermally connected to the heating element, the method comprising:
forming a plurality of primary formed bodies, each having a rectangle-shaped cross section, by inserting a cylindrical material or an elliptic cylindrical material into a first die, which has a rectangle-shaped cross section and has one side open, and by pressing the cylindrical material or the elliptic cylindrical material,
where the primary formed bodies have different cross-sectional areas;
forming the plurality of heat pipes such that side surfaces, which are adjacent to each other and orthogonal to a heat receiving surface with respect to the heating element, are in surface contact with each other by inserting the plurality of the primary formed bodies side by side into a second die, which has a rectangle-shaped cross section and has one side open, such that each one surface of the primary formed body is exposed to an opening side and by pressing the plurality of primary formed bodies at the same time,
where the plurality of the primary formed bodies are arranged in the second die in order of increasing cross-sectional area;
forming a planar bend in the plurality of heat pipes such that:
the heat pipe with the lowest cross-sectional area has the highest curvature in the planar bend; and
the heat pipe with the highest cross-section area has the lowest curvature in the planar bend; and
assembling the plurality of heat pipes, of which the side surfaces are in surface contact with each other, such that the heat receiving surface is thermally connected to the heating element with a fixture that is thermally connected to and holds the plurality of heat pipes in a region that overlaps the heating element in a first direction perpendicular to the heat receiving surfaces of the heat pipes; and
thermally connecting a vapor chamber to the fixture, wherein
the vapor chamber includes an indent that corresponds to a location of the heating element, and
the heat pipes are bent such that the heat receiving surfaces of the heat pipes are thermally connected to the heating element in the indent.

6. The method of manufacturing an electronic apparatus according to claim 5, wherein
the primary formed body is pressed while rolling a plurality of rollers, which is arranged in an extending direction of the primary formed body, in the extending direction.

* * * * *